United States Patent
Gao et al.

(10) Patent No.: US 11,614,417 B2
(45) Date of Patent: Mar. 28, 2023

(54) DETERMINING SATURATION IN LOW RESISTIVITY PAY ZONES

(71) Applicant: Saudi Arabian Oil Company, Dhahran (SA)

(72) Inventors: Jun Gao, Dhahran (SA); Hyung Tae Kwak, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 0 days.

(21) Appl. No.: 17/368,293

(22) Filed: Jul. 6, 2021

(65) Prior Publication Data

US 2023/0008054 A1    Jan. 12, 2023

(51) Int. Cl.
    G01N 24/08    (2006.01)
(52) U.S. Cl.
    CPC ................. G01N 24/081 (2013.01)
(58) Field of Classification Search
    CPC .................................... G01N 24/081
    See application file for complete search history.

(56) References Cited

U.S. PATENT DOCUMENTS

| | | |
|---|---|---|
| 4,431,968 A | 2/1984 | Edelstein et al. |
| 4,728,892 A | 3/1988 | Vinegar et al. |
| 4,868,500 A | 9/1989 | Baldwin et al. |
| 5,069,065 A | 12/1991 | Sprunt et al. |
| 5,162,733 A | 11/1992 | Baldwin |
| 5,278,501 A | 1/1994 | Guilfoyle |
| 5,289,124 A | 2/1994 | Jerosche-Herold et al. |
| 5,428,291 A | 6/1995 | Thomann et al. |
| 5,433,717 A | 7/1995 | Rubinsky et al. |
| 5,696,448 A | 10/1997 | Coates et al. |
| 6,369,567 B1 | 4/2002 | Song et al. |
| 6,415,649 B1 | 7/2002 | Spinler et al. |
| 6,765,380 B2 | 7/2004 | Freedman |
| 6,856,132 B2 | 2/2005 | Appel et al. |
| 6,883,702 B2 | 4/2005 | Hurlimann et al. |

(Continued)

FOREIGN PATENT DOCUMENTS

| | | |
|---|---|---|
| CA | 2524993 | 10/2014 |
| CN | 108226002 | 6/2018 |

(Continued)

OTHER PUBLICATIONS

"NMR log calibration from laboratory core measurements," Application Note 3, Oxford Industrial Analysis, 2015, 4 pages.

(Continued)

*Primary Examiner* — Gregory H Curran
(74) *Attorney, Agent, or Firm* — Fish & Richardson P.C.

(57) ABSTRACT

A porosity model of a core sample obtained from a subterranean formation is determined. The porosity model includes a macroporosity group and a microporosity group. A nuclear magnetic resonance (NMR) measurement is performed to obtain an NMR $T_2$ distribution of the core sample at 100% water saturation. A desaturation step is performed on the core sample. An NMR measurement is performed for the desaturation step to obtain an NMR $T_2$ distribution of the core sample. A resistivity index of the subterranean formation is determined at least based on the porosity model and each of the NMR $T_2$ distributions.

14 Claims, 6 Drawing Sheets

(56) References Cited

U.S. PATENT DOCUMENTS

| | | | |
|---|---|---|---|
| 7,221,158 | B1 | 5/2007 | Ramakrishnan |
| 7,352,179 | B2 | 4/2008 | Chen et al. |
| 7,397,240 | B2 | 7/2008 | Fleury et al. |
| 9,018,950 | B2 | 4/2015 | Li et al. |
| 9,176,081 | B2 | 11/2015 | Sen et al. |
| 9,389,193 | B1 | 7/2016 | Petrov et al. |
| 9,599,581 | B2 | 3/2017 | Kwak |
| 9,720,124 | B2 | 8/2017 | Kadayam Viswanathan et al. |
| 9,746,576 | B2 | 8/2017 | Jebutu |
| 10,145,774 | B2 | 12/2018 | Kwak et al. |
| 10,416,063 | B2 | 9/2019 | Gao et al. |
| 10,451,530 | B2 | 10/2019 | Kwak et al. |
| 10,451,571 | B2 | 10/2019 | Kwak et al. |
| 10,495,589 | B2 | 12/2019 | Kwak et al. |
| 10,533,933 | B2 | 1/2020 | Kwak et al. |
| 10,801,941 | B2 | 10/2020 | Tang et al. |
| 10,921,270 | B2 | 2/2021 | Kwak et al. |
| 10,948,439 | B2 | 3/2021 | AlSinan et al. |
| 11,035,769 | B2 | 6/2021 | Kwak et al. |
| 2003/0169040 | A1 | 9/2003 | Hurlimann |
| 2005/0168220 | A1 | 8/2005 | Lenormand et al. |
| 2006/0132131 | A1 | 6/2006 | Fleury et al. |
| 2007/0241753 | A1 | 10/2007 | Sodickson et al. |
| 2008/0303520 | A1 | 12/2008 | Chen |
| 2010/0237860 | A1* | 9/2010 | Hurlimann ........ G01R 33/56341 324/303 |
| 2010/0264915 | A1 | 10/2010 | Saldungaray et al. |
| 2011/0201892 | A1 | 8/2011 | Haig et al. |
| 2012/0241149 | A1 | 9/2012 | Chen et al. |
| 2013/0019659 | A1 | 1/2013 | Nadeev et al. |
| 2013/0261979 | A1 | 10/2013 | Al-Muthana et al. |
| 2013/0313267 | A1 | 11/2013 | Horio et al. |
| 2013/0325348 | A1 | 12/2013 | Valori et al. |
| 2014/0003557 | A1 | 1/2014 | Wu et al. |
| 2014/0055134 | A1 | 2/2014 | Fordham et al. |
| 2014/0265043 | A1 | 9/2014 | Oldroyd et al. |
| 2014/0285196 | A1 | 9/2014 | Liu et al. |
| 2014/0340082 | A1 | 11/2014 | Yang et al. |
| 2015/0219782 | A1 | 8/2015 | Viswanathan et al. |
| 2015/0346377 | A1 | 12/2015 | Jebutu et al. |
| 2016/0290942 | A1 | 10/2016 | Wang et al. |
| 2016/0313267 | A1 | 10/2016 | Kwak et al. |
| 2016/0341680 | A1 | 11/2016 | Viswanathan et al. |
| 2017/0030819 | A1 | 2/2017 | Mccarty et al. |
| 2017/0122858 | A1* | 5/2017 | Li ........................ G01N 24/081 |
| 2017/0248506 | A1 | 8/2017 | Gupta et al. |
| 2018/0348396 | A1* | 12/2018 | Hou ........................ G01V 3/26 |
| 2019/0033239 | A1 | 1/2019 | Gao et al. |
| 2019/0113429 | A1 | 4/2019 | Kwak et al. |
| 2019/0204248 | A1 | 7/2019 | Paulsen et al. |
| 2019/0317034 | A1 | 10/2019 | Kwak et al. |
| 2019/0353568 | A1 | 11/2019 | Kwak et al. |
| 2019/0369036 | A1 | 12/2019 | Kwak et al. |
| 2020/0371052 | A1 | 11/2020 | AlSinan et al. |
| 2021/0199607 | A1 | 7/2021 | AlSinan et al. |

FOREIGN PATENT DOCUMENTS

| | | |
|---|---|---|
| EP | 2872741 | 5/2015 |
| EP | 2888612 | 7/2015 |
| GB | 2505232 | 2/2014 |
| JP | 2008203154 | 9/2008 |
| WO | WO 2016171971 | 10/2016 |

OTHER PUBLICATIONS

"Routine Core Analysis—Free fluid, bound fluid and T2cutoff," Application Note 3, Magritek, available on or before Apr. 17, 2017, 5 pages.

"Temperature dependent $T_2$ spectra in carbonate cores: measurements at ambient pressure," Magritek, Application Note 4, Sep. 2013, 4 pages.

Abdallah et al., "Fundamentals of Wettability," Oilfield Review, Summer 2007, 18 pages.

Ahmed et al., "Permeability Estimation: The Various Sources and Their Interrelationships," SPE-19604-PA, Society of Petroleum Engineers (SPE), Journal of Petroleum Technology, May 1991, 43:5, 10 pages.

Al-Mahrooqi et al., "Pore-scale modelling of NMR relaxation for the characterization of wettability," Journal of Petroleum Science and Engineering, Elsevier, Jun. 2006, 52:1-4, 15 pages.

Anderson, "Wettability Literature Survey—Part 2: Wettability Measurement," Journal of Petroleum Technology, Nov. 1986, 17 pages.

Appel et al., "Restricted Diffusion And Internal Field Gradients," SPWLA 40th Annual Logging Symposium: May 30-Jun. 3, 1999, 13 pages.

Arbab, "Challenge of Water Saturation in Low Resistivity Cretaceous Reservoirs," Petroleum and Chemical Industry International, 2018, 1:1, 7 pages.

Awolayo et al., "A cohesive approach at estimating water saturation in a low-resistivity pay carbonate reservoir and its validation," J Petrol Explor Prod Technol, 2017, 7:637-657, 12 pages.

biolinscientific.com [online], "Measurements: Contact Angle," retrieved from URL <https://www.biolinscientific.com/measurements/contact-angle>, retrieved on Aug. 15, 2019, available on or before Oct. 2017 via wayback machine URL <https://web.archive.org/web/20171015000000*/https://www.biolinscientific.com/measurements/contact-angle>, 9 pages.

Bisai, "A study on modes of rock failure under uniaxial compression," Master's thesis for Master of Technology in Geotechnical Engineering, Civil Engineering, Department of Civil Engineering National Institute of Technology, May 2014, 53 pages.

Blunt, "Digital Core Analysis and its Application of Reservoir Engineering," course notes, Master of Science in Petroleum Engineering and Petroleum Geophysics, Department of Earth Science and Engineering, Imperial College London and Politecnico di Milano, May 28, 2014, 237 pages.

Bortolotti et al., "Probing Wettability Reversal in Carbonatic Rocks by Spatially-Resolved and Non-Resolved 1H-NMR Relaxation Analysis," SPE 133937, Society of Petroleum Engineers (SPE), presented at the SPE Annual Technical Conference and Exhibition, Florence, Italy, Sep. 19-22, 2019, 9 pages.

Brown and Scholz, "Broad bandwidth study of the topography of natural rock surfaces," Journal of Geophysical Research, Dec. 10, 1985, 90:B14, 9 pages.

Brown et al., "Measurements of Fractional Wettability of Oil Fields' Rocks by the Nuclear Magnetic Relaxation Method," 31st Annual Fall Meeting of the Petroleum Branch of the American institute of Mining, Metallurgical, and Petroleum Engineers, Oct. 14-17, 1956, 4 pages.

Bryar et al., "Laboratory Studies of the Effect of Sorbed Oil on Proton Nuclear Magnetic Resonance," Geophysics, May-Jun. 2003, 68:3 (942-948), 7 pages.

Cantrell and Hagerty, "Microporosity in Arab Formation Carbonates, Saudi Arabia," Geo Arabia, 1999, 4(2): 129-154, 26 pages.

Chardaire-Riviere et al., "Principle and Potential of Nuclear Magnetic Resonance Applied to the Study of Fluids in Porous Media," Oil and Gas Science and Technology: Ruve De L'Institut Francais Du Petrole, Editions Technip, Paris, Jul. 1992, 47:4, 21 pages.

Chen et al., "Pore-connectivity based permeability model for complex carbonate formations," presented at the SPWLA 49th Annual Logging Symposium, May 25-28, 2008, 11 pages.

Coates et al., "The MRIL in Conoco 33-1, An investigation of a new magnetic resonance imaging log," presented at the 32nd SPWLA Annual Logging Symposium, Jun. 16-18, 1991, 24 pages.

corelab.com [online], "Rock Properties—Advanced Rock Properties—Pore Volume Compressibility, Pore Volume Compressibility: UPVC, HPVC and RTCM," retrieved from URL <www.corelab.com/ps/pore-volume-compressibility>, retrieved on Aug. 15, 2019, available on or before 2019, 5 pages.

Costa Gomes et al., "Reservoir Rocky Typing Using NMR & Centifruge," retrieved from URL <http://www.jgmaas.com/SCA/2014/SCA2014-096.pdf>, retrieved on Oct. 23, 2018, available on or before Sep. 8, 2014, 6 pages.

(56) References Cited

OTHER PUBLICATIONS

Cotts et al., "Pulsed field gradient stimulated echo methods for improved NMR diffusion measurements in heterogeneous systems," J. Magn. Reson., Jun. 1989, 83:2 (252-266), 15 pages.

Craig, "The reservoir engineering aspects of waterflooding," HL Doherty Memorial Fund of AIME, 1971, 3, 142 pages.

Dai et al., "Permeability Anisotropy and Relative Permeability in Sediments from the National Gas Hydrate Program Expedition 02, Offshore India," Marine and Petroleum Geology Mar. 2018, 108: 705-13, 40 pages.

Deng et al., "Investigation of directional hydraulic fracturing based on true tri-axial experiment and finite element modeling," Comput. Geotech., May 2016, 75:28-47, 20 pages.

Diederix, "Anomalous relationships between resistivity index and water saturations in the Rotliegend sandstone (the Netherlands)," SPWLA 23rd Annual Logging Symposium. Society of Petrophysicists and Well-Log Analysts, 1982, 16 pages.

Dijk et al., "Investigation of flow in water-saturated rock fractures using nuclear magnetic resonance imaging (NMRI)," Water Resources Research, Feb. 1999, 35:2, 14 pages.

Dixit et al., "Empirical Measures of Wettability in Porous Media and the Relationship between Them Derived from Pore-Scale Modelling," Kluwer Academic Publishers, Jul. 2000, 28 pages.

Dixon and Marek, "The effect of bimodal-pore size distribution on electrical properties of some middle eastern limestones," SPE 20601, Society of Petroleum Engineers (SPE), presented at the 65th Annual Technical Conference and Exhibition of the Society of Petroleum Engineers, New Orleans, LA, Sep. 23-26, 1990, 8 pages.

Dudley et al., "Suggested Methods for Uniaxial-Strain Compressibility Testing for Reservoir Geomechanics," Draft to ISRM Commission on Testing, Rock Mechanics and Rock Engineering., Apr. 13, 2015, 49, 29 pages.

Engelke et al., "Three-dimensional pulsed field gradient NMR measurements of self-diffusion in anisotropic materials for energy storage applications," Phys. Chem. Chem. Phys., 2019, 21:8 (4538-4546), 10 pages.

Enwere, "Some Insight into Laboratory Core Floods using an NMRI Technique," Abstract, Jun. 1994, 2 pages.

Evans, "Predicting $CO_2$ injectivity properties for application at CCS sites," Curtin University Department of Petroleum Engineering, Jul. 2014, 160 pages.

Farouk et al., Water Saturation Uncertainty of Tight, Microporosity Dominated Carbonate Reservoirs and the Impact of Hydrocarbon Volume; Case Study for Abu Dhabi, UAE, SPWLA 55th Annual Logging Symposium, May 18-22, 2014, 9 pages.

Fheed et al., "Fracture orientation and fluid flow direction recognition in carbonates using diffusion-weighted nuclear magnetic resonance imaging: An example from Permian," J. Appl. Geophys., Mar. 2020, 174:103964, 33 pages.

Fleury and Deflandre, "Quantitative evaluation of porous media wettability using NMR relaxometry," Magnetic Resonance Imaging, Apr.-May 2003, 21:3-4, 3 pages.

Fleury, "Resistivity in carbonates: new insights," SPE 77719, Society of Petroleum Engineers (SPE), presented at the SPE Annual Technical Conference and Exhibition, Sep. 29-Oct. 2, 2002, 9 pages.

Freedman et al., "Wettability, Saturation, and Viscosity from NMR Measurements," SPE 87340, Society of Petroleum Engineers (SPE), SPE Journal, Dec. 2003, 11 pages.

Furo et al., "NMR methods applied to anisotropic diffusion," Magn. Reson. Chem., Dec. 2002, 40:13 (S3-S14), 12 pages.

Ge et al., "Determination of nuclear magnetic resonance T2 cutoff value based on multifractal theory—An application in sandstone with complex pore structure," Geophysics, Society of Exploration of Geophysics, Apr. 1, 2015, 80:1, 11 pages.

Gentier and Hopkins, "Mapping fracture aperture as a function of normal stress using a combination of casting, image analysis and modeling techniques," Int J Rock Mech Min Sci, 1997, 34:3-4 (132), 14 pages.

Ghanbarian et al., "Tortuosity in Porous Media: A Critical Review," Soil Sci. Soc. Am. J., Sep. 2013, 77:5 (1461), 19 pages.

Godefroy et al., "Temperature Effect on NMR Surface Relaxation in Rocks for Well Logging Applications," Journal of Physical Chemistry B, Oct. 9, 2002, 106, 8 pages.

Golsanami et al., "A review on the applications of the nuclear magnetic resonance (NMR) technology for investigating fractures," J. Appl. Geophys., 133: 30-38, 2016, 9 pages.

Gomes et al., "Reservoir rock typing using NMR & Centrifuge," presented at the International Symposium of the Society of Core Analysts, Avignon, France, Sep. 8-11, 2014, 6 pages.

Green Imaging Technologies Inc., "GIT Systems and LithoMetrix User Manual," Revision 1.9, Jan. 22, 2016, 179 pages.

Green Imaging Technologies Inc., "NMR and Core Analysis Technical Datasheet," GIT inc., Oxford Instruments, 2015, 8 pages.

Gugliotti, "Tears of Wine," Journal of Chemical Education, Jan. 2004, 81:1, 2 pages.

Hagoort, "Oil Recovery by Gravity Drainage," Society of Petroleum Engineers Journal, Jun. 1980, 12 pages.

Hakami and Larsson, "Aperture measurements and flow experiments on a single natural fracture, "Int J Rock Mech Min Sci Geomech Abstracts, 1996, 33:4, 10 pages.

Hakimov et al., "Pore-scale network modeling of microporosity in low-resistivity pay zones of carbonate reservoir," Journal of Natural Gas Science and Engineering 2019, 71: 103005, 15 pages.

Haldia et al., "A new approach to determine T2 cutoff value with integration of NMR, MDT pressure data in TS-V sand of Charali field," P013, 10th Biennial International Conference and Exposition, Kochi 2013, 8 pages.

Han et al., "Deviation from Archie's law in partially saturated porous media: Wetting film versus disconnectedness of the conducting phase," Physical Review E 2009, 79.3: 031127, 12 pages.

Hashim and Kaczmarek et al., "A review of the nature and origin of limestone microporosity." Marine and Petroleum Geology, 2019, 107:527-554, 28 pages.

Hassler and Brunner, "Measurement of capillary pressures in small core samples," Transactions of the AIME 160,01, Los Angeles Meeting, Oct. 1944, 10 pages.

Hirasaki et al., "Wettability Evaluation During Restored State Core Analysis," Fourth Annual Technical Conference of the Society of Core Analysts, Aug. 15-16, 1990, 28 pages.

Hitchcock et al., "NMR Studies of Cooperative Effects in Adsorption," Langmuir, American Chemical Society, Dec. 7, 2010, 26:23 (18061-18070), 10 pages.

Honarpour et al., "Relative permeability of petroleum reservoirs," CRC Press, In., Jan. 1986, 178 pages.

Huang et al., "Capillary End Effects in Coreflood Calculations," 1996 International Symposium of the Society of Core Analysts, Sep. 8-10, 1996, 10 pages.

Huang et al., "Capillary end effects in coreflood calculations," Journal of Petroleum Science and Engineering, Jan. 1998, 15 pages.

Hürlimann, "Effective Gradients in Porous Media Due to Susceptibility Differences," Journal of Magnetic Resonance 1998, 131:2 (232-40), 9 pages.

indiamart.com [online], "Triaxial cell," retrieved from URL <https://www.indiamart.com/engineering-solutions-equipment/triaxial-cells.html> retrieved on Aug. 15, 2019, available on or before Jan. 30, 2019, 2 pages.

Iwere et al., "Vug characterization and pore volume compressibility for numerical simulation of vuggy and fractured carbonate reservoirs," SPE 74341, Society of Petroleum Engineers (SPE), presented at the SPE International Petroleum Conference and Exhibition, Villahermosa, Mexico, Feb. 10-12, 2002, 9 pages.

Johnson, "Diffusion ordered nuclear magnetic resonance spectroscopy: principles and applications," Prog. Nucl. Magn. Reson. Spectrosc., May 1999, 34:3-4 (203-256), 54 pages.

Kallel et al., "Modelling the effect of wettability distributions on oil recovery from microporous carbonate reservoirs," Elsevier Ltd., Jun. 2015, 12 pages.

Karimi et al., "Reservoir Rock Characterization Using Centrifuge and Nuclear Magnetic Resonance: A Laboratory Study of Middle Bakken Cores," SPE Annual Technical Conference and Exhibition, Houston, Texas, Sep. 28-30, 2015, 19 pages.

(56) References Cited

OTHER PUBLICATIONS

Keller, "High resolution, non-destructive measurement and characterization of fracture apertures," Int J Rock Mech Min Sci, 1998, 35:8, 14 pages.

Kenyon, "Petrophysical principles of application of NMR logging," The Log Analyst, Mar.-Apr. 1997, 38:2, 23 pages.

Kleinberg et al., "Mechanism of NMR Relaxation of Fluids in Rock," Journal of Magnetic Resonance, Series A, Jun. 1994, 108, 9 pages.

Kleinhammes et al., "Gas absorption in single-walled carbon nanotubes studied by NMR," Physical Review B, American Physical Society, Aug. 2003, 68, 6 pages.

Knight et al., "The Use of Dielectric and NMR Measurements to Determine the Pore-Scale Location of Organic Contaminants," Geophysics, Department of Earth and Ocean Sciences, University of British Columbia, Jul. 15, 1997, 9 pages.

Korb et al., "Using multifrequency NMR for probing wettability," SCA2010-15, Society of Core Analysts (SCA), presented at the International Symposium of the Society of Core Analysts, Oct. 4-7, 2010, 12 pages.

Kwak et al., "The Methods of Correcting NMR Data from Dry Gas Wells Drilled with Formate Based Muds by Advanced NMR Techniques," Society of Petroleum Engineers, SPE Kingdom of Saudi Arabia Annual Technical Symposium and Exhibition, Apr. 24, 2017, 16 pages.

Kwak et al., "Toward a Method for measuring wettability in porous media by NMR water vapor isotherm technique," SCA2017-032, Society of Core Analysts (SCA), presented at the International Symposium of the Society of Core Analysts held in Vienna, Austria, Aug. 27-Sep. 1, 2017, 9 pages.

Li et al., "Spin Echo SPI Methods for Quantitative Analysis of Fluids in Porous Media," Journal of Magnetic Resonance, Academic Press: Orlando, FL, US, Jun. 1, 2009, 198:2 (252-260), 9 pages.

Looyestijn et al., "Wettability Index Determination by Nuclear Magnetic Resonance," SPE 93624, Society of Petroleum Engineers (SPE), presented at the 14th SPE Middle East Oil & Gas Show and Conference, Bahrain International Exhibition Center, Bahrain, Mar. 12-15, 2005, 8 pages.

Lucas et al., "Quantitative Porosity Mapping of Reservoir Rock Cores By Physically Slice Selected NMR," Herchel Smith Laboratory for Medicinal Chemistry, 1993, 3-24, 22 pages.

Mai et al., "Porosity Distributions in Carbonate Reservoirs Using Low-Field NMR," Journal of Canadian Petroleum Technology, Jul. 2007, 46:7 (30-37), 8 pages.

Mao et al., "NMR Studies of Gas and Water Adsorption in Carbon Based Materials," a Dissertation submitted to the Faculty of the University of North Carolina at Chapel Hill in Partial Fulfillment of the Requirements for the Degree of Doctor of Philosophy in Curriculum of Applied and Material Sciences, Chapel Hill, 2007, 134 pages.

Mao et al., "NMR study of water absorption in single-walled carbon nanotubes," Chemical Physics Letters, Apr. 15, 2006, 421:4-6, 5 pages.

Marrow "Wettability and Its Effect on Oil Recovery," Society of Petroleum Engineers SPE Distinguished Author Series, Dec. 1990, 9 pages.

Mason and Morrow, "Capillary behavior of a perfectly wetting liquid in irregular triangular tubes," Journal of Colloid and Interface Science 1991, 141.1: 262-274, 13 pages.

Matteson et al., "NMR Relaxation of Clay-Brine Mixtures," SPE Annual Technical Conference and Exhibition, New Orleans, Louisiana: Society of Petroleum Engineers, Sep. 27-30, 1998, 7, 7 pages.

Mohnke et al., "Understanding NMR relaxometry of partially water-saturated rocks." Hydrology and Earth System Sciences 2015, 19.6: 2763-2773, 11 pages.

mri-q.com [online], "Gradient Coils," retrieved from URL <http://mri-q.com/gradient-coils.html>, retrieved on Jun. 22, 2020, available on or before May 2020, 2 pages.

Nadia Testamanti et al., "Determination of NMR T2cut-off for clay bound water in shales: A case study for Carynginia Formation, Perth Basin, Western Australia," Journal of Petroleum Science and Engineering, Jan. 20, 2017, 149, 7 pages.

Neilsen et al., "Determination of Saturation Functions of Tight Core Samples Based on Measured Saturation Profiles," Sep. 1997, 11 pages.

Norgaard et al., "Capillary Pressure Curves for Low Permeability Chalk Obtained by NMR Imaging of Core Saturation Profiles," Society of Petroleum Engineers, Jan. 1995, presented at the SOE Annual Technical Conference and Exhibition, Oct. 22-25, 1995, 10 pages.

Oztop et al., "Using multi-slice-multi-echo images with NMR relaxometry to assess water and fat distribution in coated chicken nuggets," Food Science and Technology, Mar. 2014, 55.2:690-694, 5 pages.

Peng et al., "Laboratory investigation of shale rock to identify fracture propagation in vertical direction to bedding," J. Geophys. Eng., Jun. 2018, 15:3 (696-706), 18 pages.

perminc.com [online], "Chapter 2: Multi-phase saturated rock properties: Laboratory Measurement of Capillary Pressure: Centrifugal Method," retrieved from URL <www.perminc.com/resources/fundamentals-of-fluid-flow-in-porous-media/chapter-2-the-porous-medium/multi-phase-saturated-rock-properties/laboratory-measurement-capillary-pressure/centrifugal-method/>, retrieved on Aug. 15, 2019, available on or before Oct. 2015 via wayback machine URL<https://web.archive.org/web/20150915000000*/http://perminc.com/resources/fundamentals-of-fluid-flow-in-porous-media/chapter-2-the-porous-medium/multi-phase-saturated-rock-properties/laboratory-measurement-capillary-pressure/centrifugal-method/>, 4 pages.

Peters, "Advanced Petrophysics: Geology, porosity, absolute permeability, heterogeneity, and geostatistics," Greenleaf Book Group, 2012, 1:50-53, 5 pages.

Petrov et al., "Local T2 Distribution Measurements with DANTE-Z Slice Selection," Abstract, Feb. 2012, 3 pages.

Petrov et al., "T2 distribution mapping profiles with phase-encode MRI," Journal of Magnetic Resonance, Mar. 2011, 209:39-46, 9 pages.

petrowiki.org [online], "Porosity determination with NMR logging," available on or before Jun. 24, 2015, retrieved from URL <https://petrowiki.org/Porosity_determination_with_NMR_logging>, 6 pages.

Qiao et al., "Diffusion Correlation NMR Spectroscopic Study of Anisotropic Diffusion of Water in Plant Tissues," Biophys. J., Oct. 2005, 89:4 (2899-2905), 7 pages.

Radke et al., "A Pore-Level Scenario for the Development of Mixed Wettability in Oil Reservoirs," Society of Petroleum Engineers, Jun. 1993, presented at the 67th Annual Technical Conference and Exhibition of the Society of Petroleum Engineers, Oct. 4-7, 1992, 15 pages.

Ramakrishnan et al., "A new technique to measure static and dynamic properties of a partially saturated porous medium," Chemical Engineering Science, Dec. 1991, 46:4, 7 pages.

Richardson et al., "Laboratory Determination of Relative Permeability," Journal of Petroleum Technology, Aug. 1952, 11 pages.

Romanenko et al., "An assessment of non-wetting phase relative permeability in water-wet sandstones based on quantitative MRI of capillary end effects," Journal of Petroleum Science and Engineering, Elsevier Ltd., Sep. 2013, 7 pages.

Ruth, "Analysis of Centrifuge Relative Permeability Data," University of Manitoba, 1997, 10 pages.

Salathiel et al., "Oil Recovery by Surface Film Drainage In Mixed-Wettability Rocks," Journal of Petroleum Technology, Oct. 1973, 9 pages.

Schaefer et al., "Measurement of pore connectivity to describe diffusion through a nonaqueous phase in unsaturated soils," Journal of Contaminant Hydrology, Dec. 15, 1999, 40:3, 18 pages.

Seevers, "A Nuclear Magnetic Method for Determining the Permeability of Sandstones," Paper L, presented at the SPWLA 7th Annual Logging Symposium, May 8-11, 1966, 14 pages.

(56) References Cited

OTHER PUBLICATIONS

Sharifzadeh et al., "Rock joint surfaces measurement and analysis of aperture distribution under different normal and shear loading using GIS," Rock Mechanics and Rock Engineering, Apr. 2008, 38 pages.
Spinier et al., "Capillary Pressure Scanning Curves by Direct Measurement of Saturation," 1997, 13 pages.
Straley et al., "Low-field NMR Profiles for Verification of Oil and Water Saturation in Cores," presented at the International Symposium of the Society of Core Analysts, Trodheim, Norway, Sep. 12-16, 2006, 12 pages.
Swanson, "Microporosity in reservoir rocks: Its measurement and influence on electrical resistivity," The Log Analyst 26.06, SPWLA Twenty-Sixth Annual Logging Symposium, Jun. 17-20, 1985, 17 pages.
theconstructor.org [online], "Laboratory Tests for determining strength of rocks," retrieved from URL <https://theconstructor.org/building/laboratory-tests-determine-strength-rocks/11665/>, retrieved on Aug. 15, 2019, available on or before 2019, 4 pages.
Thompson et al., "Deuterium magnetic resonance and permeability in porous media," Journal of Applied Physics, Apr. 15, 1989, 65:8, 6 pages.
Timur, "An investigation of permeability, porosity, and residual water saturation relationships for Sandstone Reservoirs," The Log Analyst, Jul.-Aug. 1968, 9:4, 10 pages.
Timur, "Effective Porosity and Permeability of Sandstones Investigated Through Nuclear Magnetic Principles," The Log Analysis, presented at SPWLA Ninth Annual Logging Symposium, Jun. 23-26, 1968, 10:1, 18 pages.
Timur, "Pulsated Nuclear Magnetic Resonance Studies of Porosity, Movable Fluid and Permeability of Sandstones," SPE-2045-PA, Society of Petroleum Engineers (SPE), Journal of Petroleum Technology, Jun. 1969, 21:6, 12 pages.
Tipura, "Wettability Characterization by NMR T2 Measurements in Edwards Limestone," Master Thesis in Reservoir Physics, Universitas Bergensis, Mar. 2008, 91 pages.
Vashaee et al., "Local T2 Measurement Employing Longitudinal Hadamard Encoding and Adiabatic Inversion Pulses in Porous Media," Journal of Magnetic Resonance, 2015, 8 pages.
Vashaee, "A Comparison of Magnetic Resonance Methods for Spatially Resolved T2 Distribution Measurements in Porous Media," Apr. 2015, 18 pages.
vinvi-technologies.com [online], "Determination of Capillary pressure and relative permeability curves, with refrigerated centrifuge," retrieved from URL <https://www.vinci-technologies.com/images/contenu/documents/application-note-Centrifuge-RC4500.pdf>, retrieved on Aug. 15, 2019, available on or before Feb. 2019, 6 pages.
Wang et al., "Temperature-Induced Hydrophobic-Hydrophilic Transition Observed by Water adsorption," Science, Oct. 2008, 322:5898, 4 pages.
Wang et al., "Water Adsorption in Nanoporous Carbon Characterized by in Situ NMR: Measurements of Pore Size and Pore Size Distribution," The Journal of Physical Chemistry C, American Chemical Society Publications, Apr. 2014, 7 pages.
Wasiuddin et al., "Effect of Sasobit and Aspha-Min on Wettability and Adhesion Between Asphalt Binders and Aggregates," Transportation Research Record: Journal of the Transportation Research Board, No. 2051, Dec. 2008, 10 pages.
wikipedia.org [online], "Heavy Water," retrieved from URL <https://en.wikipedia.org/wiki/Heavy_water>, retrieved on Aug. 15, 2019, available on or before Jan. 2004, 9 pages.
Worthington, "Recognition and evaluation of low-resistivity pay." Petroleum geoscience 2000, 6.1:77-92, 16 pages.
Yang et al., "Quantitative Tortuosity Measurements of Carbonate Rocks Using Pulsed Field Gradient NMR," Transp. Porous Media, Sep. 2019, 130: 847-865, 19 pages.
Yao et al. "Petrophysical characterization of coals by low-field nuclear magnetic resonance (NMR)," Fuel 89.7, Jul. 2010, 1371-1380, 10 pages.
Zhang et al., "Interpretations of Wettability in Sandstones with NMR Analysis," SCA-9921, Society of Core Analysts (SCA), May 2000, 13 pages.
Zhao et al., "Investigation of hydraulic fracturing behavior in heterogeneous laminated rock using a micromechanics-based numerical approach," Energies, 2019, 12:18, 24 pages.

\* cited by examiner

DETERMINING SATURATION IN LOW RESISTIVITY PAY ZONES

TECHNICAL FIELD

This disclosure relates to determining characteristics of low resistivity pay zones.

BACKGROUND

Low resistivity pay zones have been known to exist in clastic and carbonate reservoirs across the world. Low resistivity pay zones, which can produce valuable dry crude oil with little water, are often missed because at first glance, they appear to be areas that produce mainly water according to conventional evaluation methods. Low resistivity pay zones are difficult to identify and characterize because they are often indistinguishable from wet zones, which are typically not profitable to produce.

SUMMARY

This disclosure describes technologies relating to identification of low resistivity pay zones and determining saturation of low resistivity pay zones.

Certain aspects of the subject matter can be implemented as a method. A porosity model of a core sample obtained from a subterranean formation is determined. The porosity model includes a macroporosity group and a microporosity group. The macroporosity group is associated with inscribed spheres representing pores of the core sample. The microporosity group is associated with a crevice network representing crevices in between the pores of the core sample. A first nuclear magnetic resonance (NMR) measurement is performed to obtain a first NMR $T_2$ distribution of the core sample. A first desaturation step is performed on the core sample. The first desaturation step includes centrifuging the core sample at a first rotational speed. A second NMR measurement is performed to obtain a second NMR $T_2$ distribution of the core sample after the first desaturation step. A second desaturation step is performed on the core sample. The second desaturation step includes centrifuging the core sample at a second rotational speed greater than the first rotational speed. A third NMR measurement is performed to obtain a third NMR $T_2$ distribution of the core sample after the second desaturation step. A resistivity index of the subterranean formation is determined at least based on the porosity model, the first, second, and third NMR $T_2$ distributions of the core sample.

This, and other aspects, can include one or more of the following features.

In some implementations, the subterranean formation from which the core sample is obtained includes a clastic reservoir or a carbonate reservoir.

In some implementations, a third desaturation step is performed on the core sample. The third desaturation step can include centrifuging the core sample at a third rotational speed greater than the second rotational speed. In some implementations, a fourth NMR measurement is performed to obtain a fourth NMR $T_2$ distribution of the core sample after the third desaturation step. Determining the resistivity index of the subterranean formation can include determining the resistivity index at least based on the porosity model, the first, second, third, and fourth NMR $T_2$ distributions of the core sample.

In some implementations, the first rotational speed is in a range of from about 500 revolutions per minute (rpm) to about 4,000 rpm. In some implementations, the second rotational speed is in a range of from about 4,000 rpm to about 6,000 rpm. In some implementations, the third rotational speed is in a range of from about 6,000 rpm to about 8,000 rpm.

In some implementations, determining the resistivity index of the subterranean formation includes determining a combination of a first saturation exponent associated with the macroporosity group and a second saturation exponent associated with the microporosity group that correlates to the first, second, and third NMR $T_2$ distributions of the core sample. In some implementations, the resistivity index (RI) is determined to be:

$$RI = \frac{1}{S_w^{\left(\frac{n_1 S_{w1}}{S_w} + \frac{n_2 S_{w2}}{S_w}\right)}}$$

where $S_{w1}$ is a water saturation of the macroporosity group, $n_1$ is the first saturation exponent associated with the macroporosity group, $S_{w2}$ is a water saturation of the microporosity group, and $n_2$ is the second saturation exponent associated with the microporosity group.

In some implementations, determining the combination of the first saturation exponent and the second saturation exponent that correlates to the first, second, and third NMR $T_2$ distributions of the core sample includes generating a log-log plot for the resistivity index and water saturation of the core sample.

Certain aspects of the subject matter described can be implemented as a method. A porosity model of a core sample obtained from a subterranean formation is determined. The porosity model includes a macroporosity group and a microporosity group. The macroporosity group is associated with pores of the core sample. The microporosity group is associated with crevices in between the pores of the core sample. A nuclear magnetic resonance (NMR) measurement is performed to obtain an NMR $T_2$ distribution of the core sample at 100% water saturation. Multiple desaturation steps are performed on the core sample. Each desaturation step includes centrifuging the core sample at different rotational speeds. For each desaturation step, an NMR measurement is performed to obtain an NMR $T_2$ distribution of the core sample. A resistivity index of the subterranean formation is determined at least based on the porosity model and each of the NMR $T_2$ distributions.

This, and other aspects, can include one or more of the following features.

In some implementations, determining the resistivity index of the subterranean formation includes determining a combination of a first saturation exponent associated with the macroporosity group and a second saturation exponent associated with the microporosity group that correlates to each of the NMR $T_2$ distributions.

In some implementations, the resistivity index (RI) is determined to be:

$$RI = \frac{1}{S_w^{\left(\frac{n_1 S_{w1}}{S_w} + \frac{n_2 S_{w2}}{S_w}\right)}}$$

where $S_{w1}$ is a water saturation of the macroporosity group, $n_1$ is the first saturation exponent associated with the macroporosity group, $S_{w2}$ is a water saturation of the microporosity group, and $n_2$ is the second saturation exponent associated with the microporosity group.

In some implementations, each of the rotational speeds are in a range of from about 500 revolutions per minute (rpm) to about 8,000 rpm. In some implementations, each subsequent rotational speed is greater than its preceding rotational speed.

In some implementations, determining the combination of the first saturation exponent and the second saturation exponent that correlates to the NMR $T_2$ distributions of the core sample includes generating a log-log plot for the resistivity index and water saturation of the core sample.

The details of one or more implementations of the subject matter of this disclosure are set forth in the accompanying drawings and the description. Other features, aspects, and advantages of the subject matter will become apparent from the description, the drawings, and the claims.

DETAILED DESCRIPTION

This disclosure describes identifying low resistivity pay zones and characterizing the saturation of low resistivity pay zones. Low resistivity pay zones have been found in many clastic and carbonate reservoirs all over the world. There is no one, single cause that results in low resistivity. Various causes (e.g., laminated reservoir, fresh formation waters, multimodal pore-size/internal microporosity/superficial microporosity, anomalously high surface area/fine-grained sands, and conductive minerals) have been proposed. Many causes are reservoir-specific, and the terms used are often descriptive and not universal. Pore-scale models of varying sophistication have been devised to explain causes of low resistivity and predict the saturation exponent in Archie's second equation. However, most conventional methods require direct formation tests and/or production to verify the existence of a low resistivity pay zone. The subject matter described in this disclosure can be implemented in particular implementations, so as to realize one or more of the following advantages. The subject matter described can be implemented to identify low resistivity rock and estimate the saturation exponent by non-destructive nuclear magnetic resonance (NMR) measurements. Oil saturation of a low resistivity pay zone can be accurately estimated, such that excessive water production (resulting from overestimating oil saturation) is avoided. Oil saturation of a low resistivity pay zone can be accurately estimated, such that valuable oil is not left un-produced, which can happen if oil saturation is underestimated (e.g., the low resistivity pay zone is misidentified as a wet zone).

Figure 1:
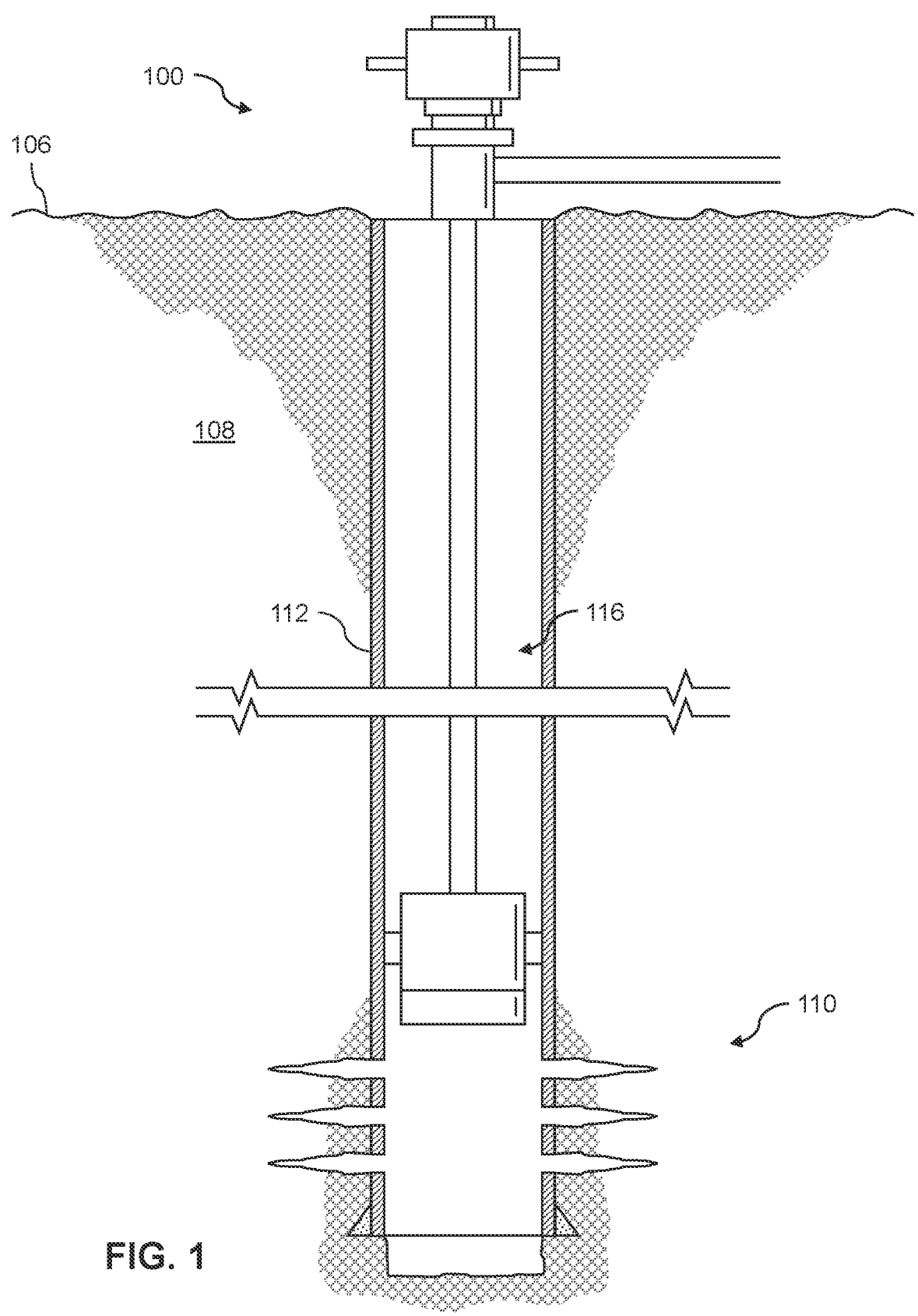
FIG. 1 is a schematic diagram of an example well.

FIG. 1 depicts an example well 100 constructed in accordance with the concepts herein. The well 100 extends from the surface 106 through the Earth 108 to one more subterranean zones of interest 110 (one shown). The well 100 enables access to the subterranean zones of interest 110 to allow recovery (that is, production) of fluids to the surface 106 (represented by flow arrows in FIG. 1) and, in some implementations, additionally or alternatively allows fluids to be placed in the Earth 108. In some implementations, the subterranean zone 110 is a formation within the Earth 108 defining a reservoir, but in other instances, the zone 110 can be multiple formations or a portion of a formation. The subterranean zone can include, for example, a formation, a portion of a formation, or multiple formations in a hydrocarbon-bearing reservoir from which recovery operations can be practiced to recover trapped hydrocarbons. In some implementations, the subterranean zone includes an underground formation of naturally fractured or porous rock containing hydrocarbons (for example, oil, gas, or both). In some implementations, the well can intersect other types of formations, including reservoirs that are not naturally fractured. For simplicity's sake, the well 100 is shown as a vertical well, but in other instances, the well 100 can be a deviated well with a wellbore deviated from vertical (for example, horizontal or slanted), the well 100 can include multiple bores forming a multilateral well (that is, a well having multiple lateral wells branching off another well or wells), or both.

In some implementations, the well 100 is a gas well that is used in producing hydrocarbon gas (such as natural gas) from the subterranean zones of interest 110 to the surface 106. While termed a "gas well," the well need not produce only dry gas, and may incidentally or in much smaller quantities, produce liquid including oil, water, or both. In some implementations, the well 100 is an oil well that is used in producing hydrocarbon liquid (such as crude oil) from the subterranean zones of interest 110 to the surface 106. While termed an "oil well," the well not need produce only hydrocarbon liquid, and may incidentally or in much smaller quantities, produce gas, water, or both. In some implementations, the production from the well 100 can be multiphase in any ratio. In some implementations, the production from the well 100 can produce mostly or entirely liquid at certain times and mostly or entirely gas at other times. For example, in certain types of wells it is common to produce water for a period of time to gain access to the gas in the subterranean zone. The concepts herein, though, are not limited in applicability to gas wells, oil wells, or even production wells, and could be used in wells for producing other gas or liquid resources or could be used in injection wells, disposal wells, or other types of wells used in placing fluids into the Earth.

The wellbore of the well 100 is typically, although not necessarily, cylindrical. All or a portion of the wellbore is lined with a tubing, such as casing 112. The casing 112 connects with a wellhead at the surface 106 and extends downhole into the wellbore. The casing 112 operates to isolate the bore of the well 100, defined in the cased portion of the well 100 by the inner bore 116 of the casing 112, from the surrounding Earth 108. The casing 112 can be formed of a single continuous tubing or multiple lengths of tubing joined (for example, threadedly) end-to-end. In FIG. 1, the casing 112 is perforated in the subterranean zone of interest 110 to allow fluid communication between the subterranean zone of interest 110 and the bore 116 of the casing 112. In some implementations, the casing 112 is omitted or ceases in the region of the subterranean zone of interest 110. This portion of the well 100 without casing is often referred to as "open hole." The wellhead defines an attachment point for other equipment to be attached to the well 100. For example, FIG. 1 shows well 100 being produced with a Christmas tree attached to the wellhead. The Christmas tree includes valves used to regulate flow into or out of the well 100.

Figure 2:
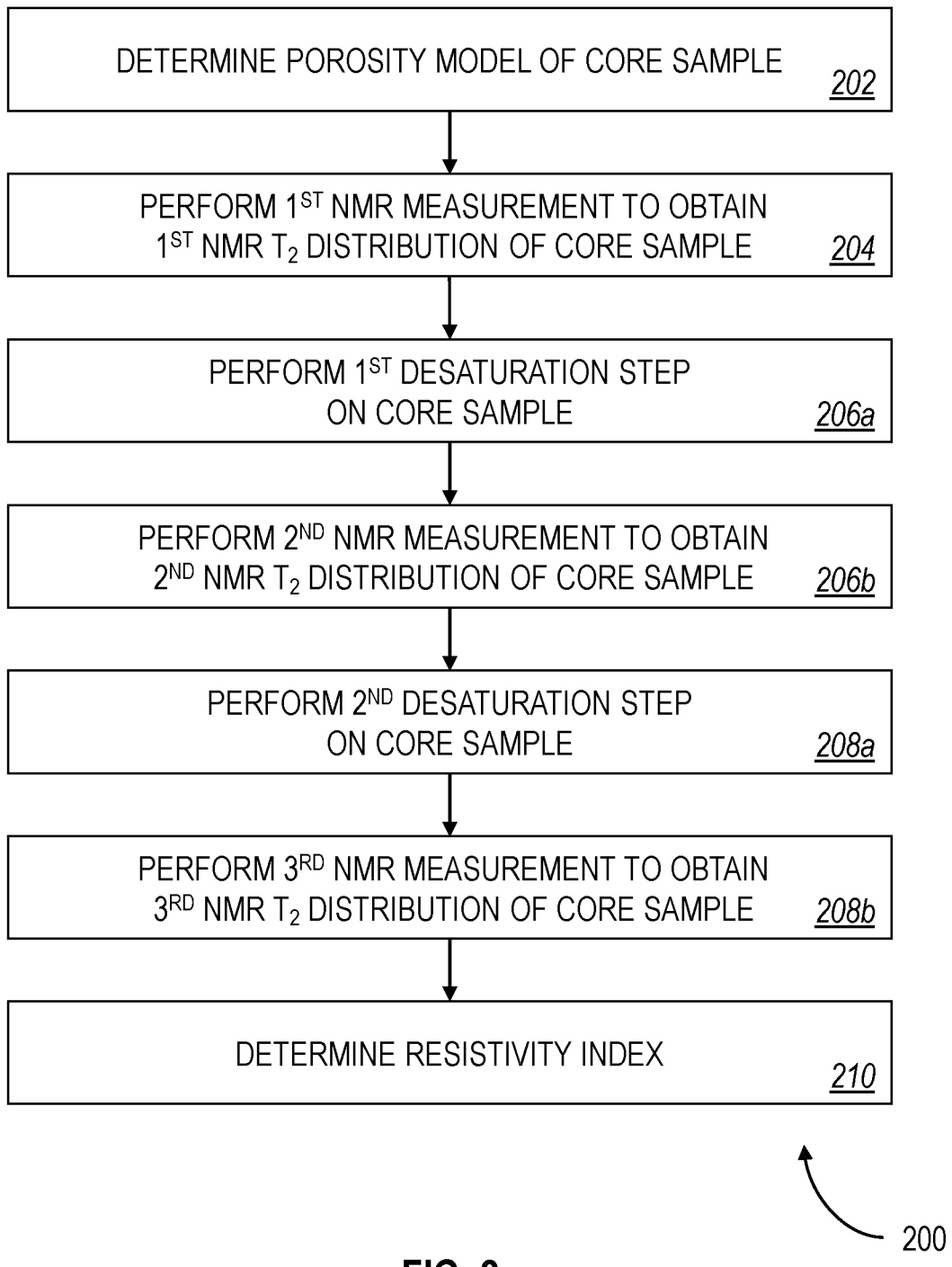
FIG. 2 is a flow chart of an example method for characterizing saturation of a subterranean formation.

FIG. 2 is a flow chart of a method 200 that can be implemented to determine characteristics of a well, such as the well 100. A core sample from a subterranean formation (for example, the subterranean formation into which the well 100 is formed) is obtained. In some implementations, the subterranean formation includes a clastic reservoir or a carbonate reservoir. Clastic reservoirs include sediment that includes broken fragments derived from pre-existing rocks that have been transported and re-deposited before forming new rock. An example of clastic sedimentary rock includes siliciclastic rock, such as conglomerate rock, sandstone, siltstone, and shale. Carbonate rock is a class of sedimentary rock whose main mineral constituents are calcite, aragonite, and dolomite. Some examples of carbonate rock include limestone, dolostone (dolomite), and chalk. Although carbonate rocks can be clastic in origin, carbonate rocks are more commonly formed through processes of precipitation or the activity of organisms, such as coral and algae.

At step 202, a porosity model of the core sample is determined. The porosity model determined at step 202 includes a macroporosity group and a microporosity group. The macroporosity group is associated with inscribed spheres representing pores of the core sample. The microporosity group is associated with a crevice network representing crevices in between the pores of the core sample. Without being bound to theory, it is postulated that the low resistivity of microporous rocks (such as clastic or carbonate rocks) is caused by the microporosity group associated with the crevice network, representing crevices in between the pores of the rock.

At step 204, a first NMR measurement is performed on the core sample to obtain a first NMR $T_2$ distribution of the core sample. The first NMR measurement is performed at step 204 at 100% water saturation of the core sample.

At step 206a, a first desaturation step is performed on the core sample. The first desaturation step includes centrifuging the core sample at a first rotational speed. In some implementations, the first rotational speed is in a range of from about 500 revolutions per minute (rpm) to about 4,000 rpm. After performing the first desaturation step at step 206a, a second NMR measurement is performed on the core sample to obtain a second NMR $T_2$ distribution of the core sample at step 206b.

At step 208a a second desaturation step is performed on the core sample. The second desaturation step includes centrifuging the core sample at a second rotational speed. The second rotational speed at step 208a is greater than the first rotational speed at step 206a. In some implementations, the second rotational speed is in a range of from about 4,000 rpm to about 6,000 rpm. After performing the second desaturation step at step 208a, a third NMR measurement is performed on the core sample to obtain a third NMR $T_2$ distribution of the core sample at step 208b.

At step 210, a resistivity index (RI) of the subterranean formation (from which the core sample was obtained) is determined at least based on the porosity model (202), the first NMR $T_2$ distribution of the core sample (204), the second NMR $T_2$ distribution of the core sample (206b), and the third NMR $T_2$ distribution of the core sample (208b).

In some implementations, determining the RI of the subterranean formation at step 210 includes determining a combination of a first saturation exponent associated with the macroporosity group and a second saturation exponent associated with the microporosity group that correlates to the first NMR $T_2$ distribution of the core sample (204), the second NMR $T_2$ distribution of the core sample (206b), and the third NMR $T_2$ distribution of the core sample (208b). In some implementations, the RI is calculated at step 210 by Equation (1):

$$RI = \frac{1}{S_w^{\left(\frac{n_1 S_{w1}}{S_w} + \frac{n_2 S_{w2}}{S_w}\right)}} \quad (1)$$

where $S_{w1}$ is a water saturation of the macroporosity group, $n_1$ is the first saturation exponent associated with the macroporosity group, $S_{w2}$ is a water saturation of the microporosity group, and $n_2$ is the second saturation exponent associated with the microporosity group. Water saturation is the fraction of water in a given pore space, expressed in volume/volume or percent.

The first saturation exponent for the macroporosity group has typically been assumed to be close to 2. During desaturation, the wetting phase (e.g., water) in the crevice network (microporosity group) remain connected for the flow of electrons (related to resistivity), while the inscribed spheres (macroporosity group) become unavailable for the flow of electrons. Thus, the resistivity of the crevice network (microporosity group) does not increase as quickly as the inscribed spheres (macroporosity group), resulting in a second saturation exponent ($n_2$) of less than 2.

Figure 5:
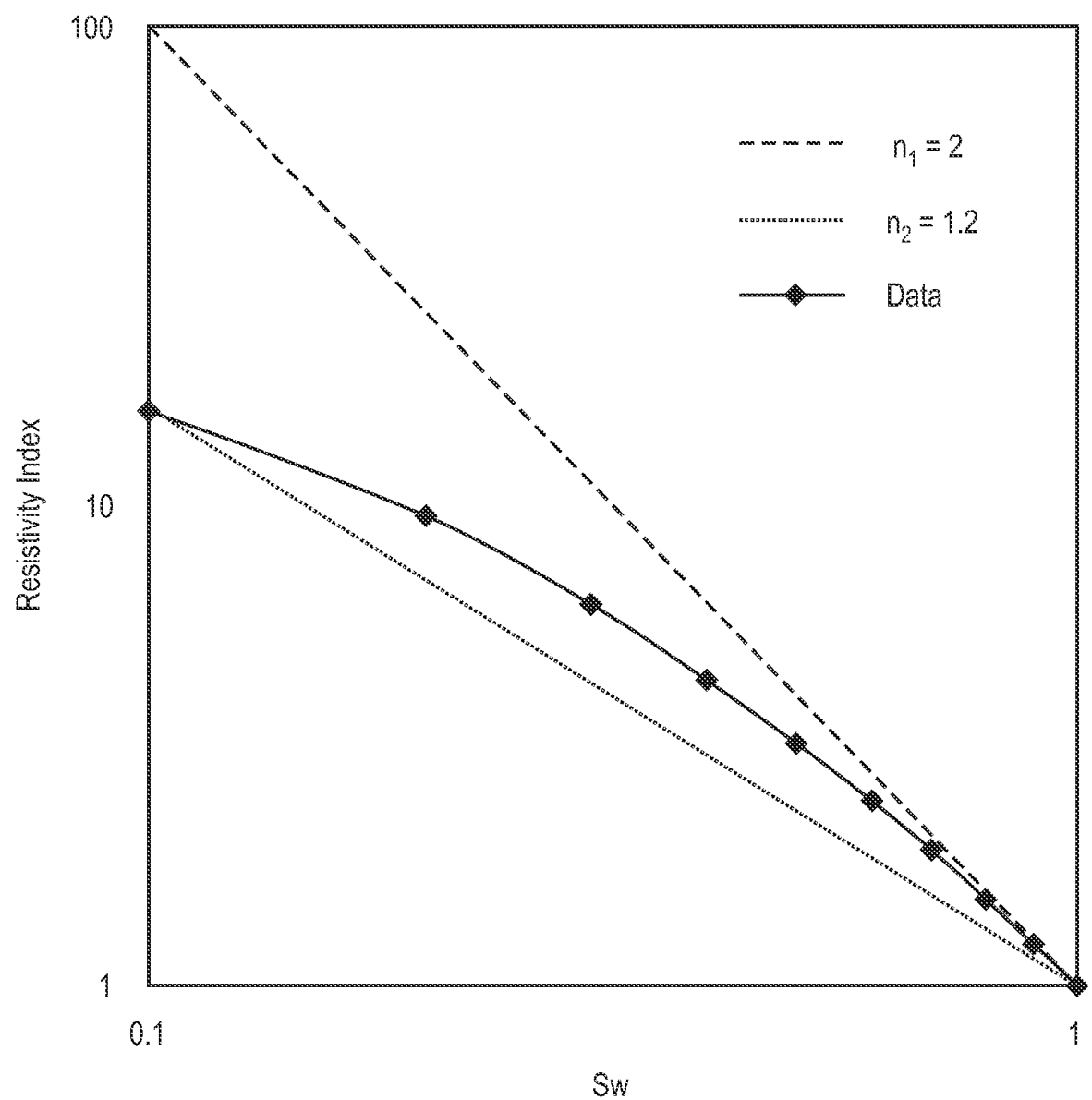
FIG. 5 is a plot showing a relationship between a resistivity index and water saturation of a core sample.

In some implementations, determining the combination of the first saturation exponent ($n_1$) and the second saturation exponent ($n_2$) that correlates to the first NMR $T_2$ distribution of the core sample (204), the second NMR $T_2$ distribution of the core sample (206b), and the third NMR $T_2$ distribution of the core sample (208b) includes generating a log-log plot for the RI and water saturation of the core sample. An example of a log-log plot for RI and water saturation is shown in FIG. 5 and described in more detail later.

In some implementations, a third desaturation step is performed on the core sample before step 210. The third desaturation step includes centrifuging the core sample at a third rotational speed. The third rotational speed is greater than the second rotational speed at step 208a. In some implementations, the third rotational speed is in a range of from about 6,000 rpm to about 8,000 rpm. In implementations where a third desaturation step is performed, a fourth NMR measurement is performed on the core sample to obtain a fourth NMR $T_2$ distribution of the core sample after the third desaturation step. In such implementations, the RI is determined at step 210 at least based on the porosity model (202), the first NMR $T_2$ distribution of the core sample (204), the second NMR $T_2$ distribution of the core sample (206b), the third NMR $T_2$ distribution of the core sample (208b), and the fourth NMR $T_2$ distribution of the core sample.

In some implementations, determining the RI of the subterranean formation at step 210 includes determining a combination of the first saturation exponent associated with the macroporosity group and the second saturation exponent associated with the microporosity group that correlates to the first NMR $T_2$ distribution of the core sample (204), the second NMR $T_2$ distribution of the core sample (206b), the third NMR $T_2$ distribution of the core sample (208b), and the fourth NMR $T_2$ distribution of the core sample. In some implementations, determining the combination of the first saturation exponent ($n_1$) and the second saturation exponent ($n_2$) that correlates to the first NMR $T_2$ distribution of the core sample (204), the second NMR $T_2$ distribution of the core sample (206b), the third NMR $T_2$ distribution of the core sample (208b), and the fourth NMR $T_2$ distribution of the core sample includes generating a log-log plot for the RI and water saturation of the core sample.

Figure 3:
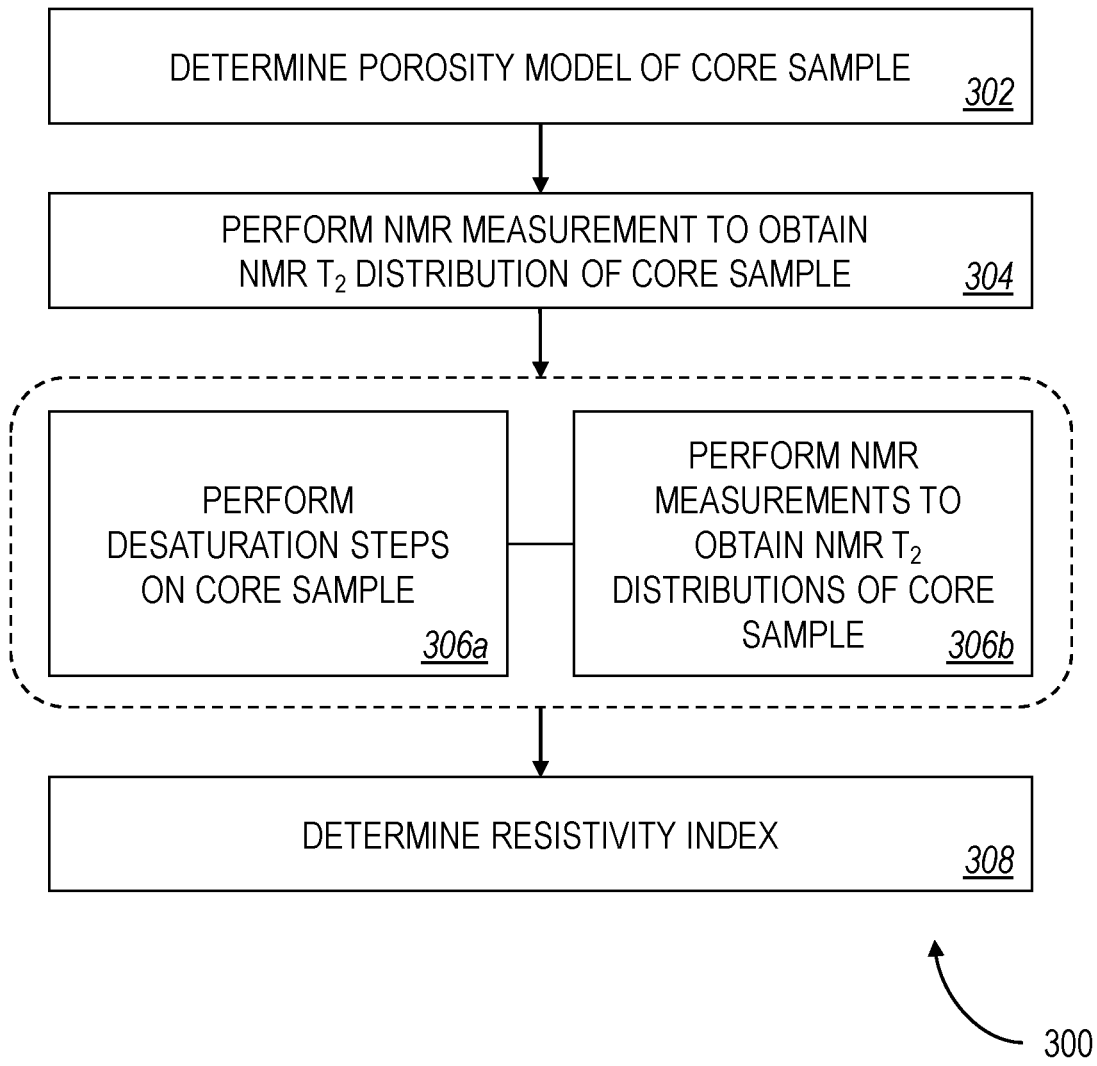
FIG. 3 is a flow chart of an example method for characterizing saturation of a subterranean formation.

FIG. 3 is a flow chart of a method 300 that can be implemented to determine characteristics of a well, such as the well 100. A core sample from a subterranean formation (for example, the subterranean formation into which the well 100 is formed) is obtained. In some implementations, the subterranean formation includes a clastic reservoir or a carbonate reservoir.

At step 302, a porosity model of the core sample is determined. The porosity model determined at step 202 includes a macroporosity group and a microporosity group. The macroporosity group is associated pores of the core sample. For example, the macroporosity group includes inscribed spheres that represent the pores of the core sample. The microporosity group is associated with crevices in between the pores of the core sample. For example, the microporosity group includes a crevice network that represents the crevices in between the pores of the core sample.

At step 304, an NMR measurement is performed on the core sample to obtain an NMR $T_2$ distribution of the core sample. The NMR measurement is performed at step 304 at 100% water saturation of the core sample.

At step 306a, multiple desaturation steps are performed on the core sample. For example, two, three, or more than three desaturation steps are performed on the core sample at step 306a. Each desaturation step at step 306a includes centrifuging the core sample at a different rotational speed. In some implementations, each of the rotational speeds of the desaturation steps at step 306a are in a range of from about 500 rpm to about 8,000 rpm. In some implementations, each subsequent rotational speed is greater than its preceding rotational speed. For example, at step 306a, a first desaturation step at 3,300 rpm, a second desaturation step at 4,700 rpm, and a third desaturation step at 6,500 rpm are performed on the core sample.

At step 306b, an NMR measurement is performed on the core sample to obtain an NMR $T_2$ distribution of the core sample for each desaturation step at step 306a. For example, if three desaturation steps are performed at step 306a, then three NMR $T_2$ distributions are obtained at step 306b (one for each desaturation step).

At step 308, an RI of the subterranean formation is determined at least based on the porosity model (302) and each of the NMR $T_2$ distributions (304, 306b). In some implementations, determining the RI of the subterranean formation at step 308 includes determining a combination of a first saturation exponent associated with the macroporosity group and a second saturation exponent associated with the microporosity group that correlates to the NMR $T_2$ distributions of the core sample (304, 306b). In some implementations, the RI is calculated at step 308 by Equation (1). In some implementations, determining the combination of the first saturation exponent ($n_1$) and the second saturation exponent ($n_2$) that correlates to the NMR $T_2$ distributions of the core sample (304, 306b) includes generating a log-log plot for the RI and water saturation of the core sample.

Figure 4:
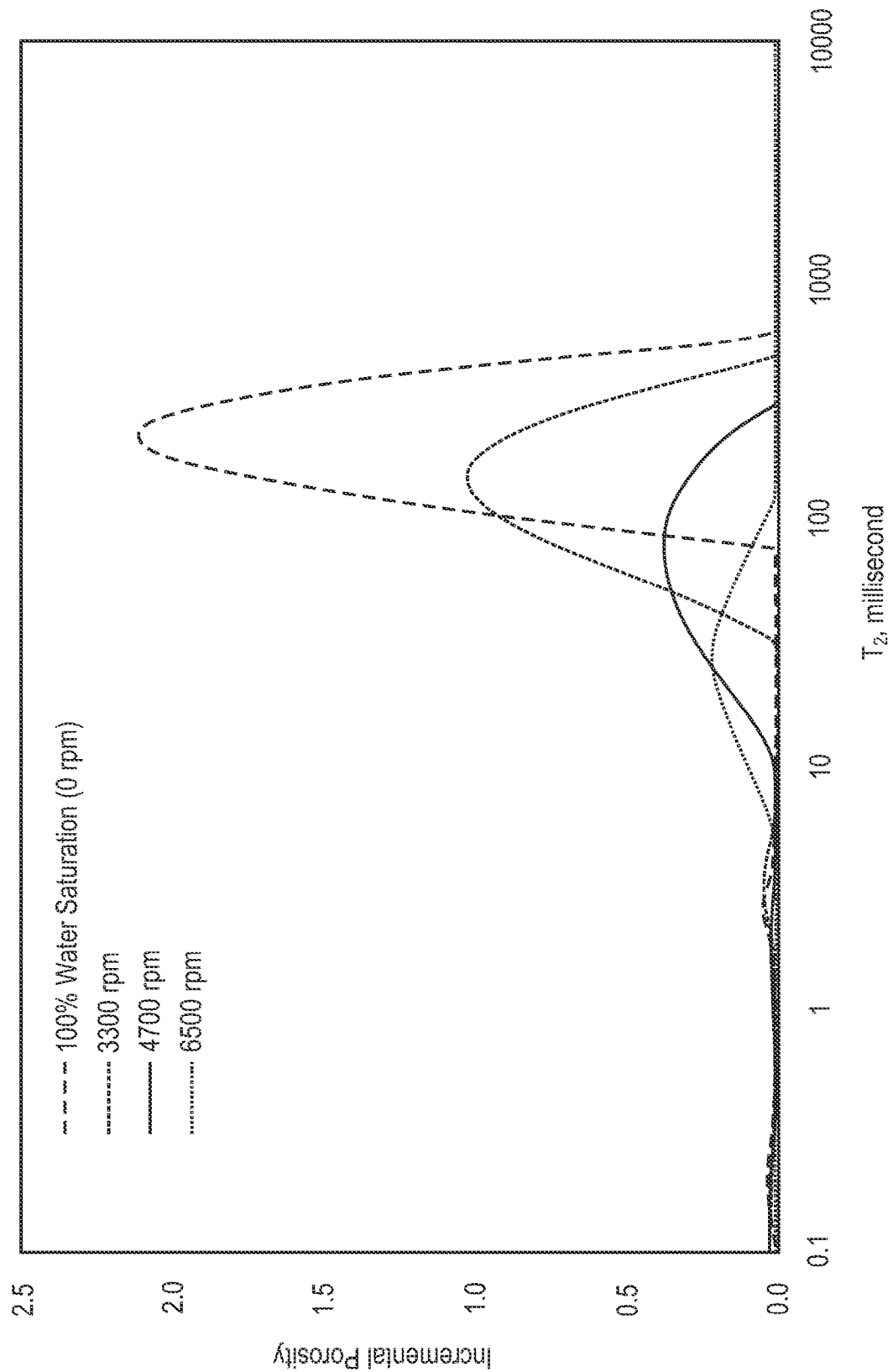
FIG. 4 is a plot showing various nuclear magnetic resonance $T_2$ (NMR $T_2$) distributions of a core sample at different saturations.

FIG. 4 is a plot 400 showing various NMR $T_2$ distributions of a low resistivity core sample at different saturation levels. Four NMR $T_2$ distributions were obtained: one at 100% water saturation, one after desaturation via centrifuging at 3,300 rpm, one after desaturation via centrifuging at 4,700 rpm, and one after desaturation via centrifuging at 6,500 rpm. Each NMR $T_2$ distribution associated with the desaturation steps can be considered to include two portions: a first portion that overlaps with the NMR $T_2$ distribution for 100% water saturation and a second portion that does not overlap with the NMR $T_2$ distribution for 100% water saturation. For each NMR $T_2$ distribution associated with the desaturation steps, the area under the curve for the first portion (overlapping with 100% water saturation) can be attributed to the water contained in the macroporosity group (inscribed spheres representing the pores of the core sample), and the area under the curve for the second portion (non-overlapping with 100% water saturation) can be attributed to the water contained in the microporosity group (crevice network representing the crevices in between the pores of the core sample). At the beginning of desaturation (for example, the desaturation steps at slower rotational speed), the water saturation of the microporosity group (crevice network) is relatively small in comparison to overall saturation. As desaturation continues (at faster rotational speeds), the water saturation of the microporosity group grows relatively large, approaching total desaturation. Therefore, it can be seen from plot 400 that the macroporosity group (inscribed spheres) dominates near the beginning of desaturation, while the microporosity group (crevice network) dominates near the end of desaturation.

FIG. 5 a log-log plot 500 for RI and water saturation. To generate the log-log plot 500, ten NMR measurements were taken: one at 100% water saturation ($S_w=1$) and nine for nine desaturation steps (via centrifuging at increasing rotational speeds) all the way down to $S_w=0.1$. As shown in the plot 500, a combination of $n_1=2$ and $n_2=1.2$ provided the best fit for RI in comparison to the NMR measurements. The data-fitting was performed by a computer system. An example of a computer system is shown in FIG. 6.

Figure 6:
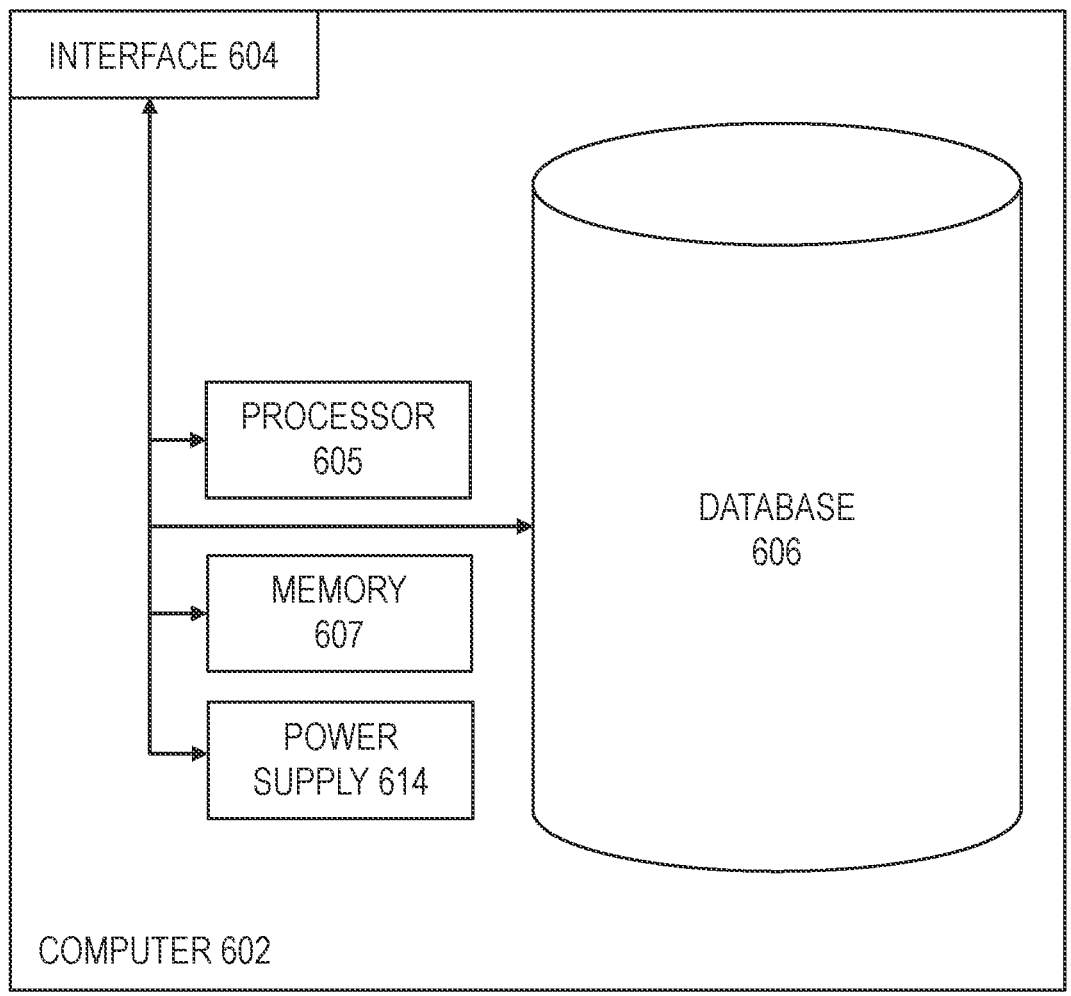
FIG. 6 is a block diagram of an example computer system.

FIG. 6 is a block diagram of an example computer system 600 used to provide computational functionalities associated with described algorithms, methods, functions, processes, flows, and procedures, as described in this specification, according to an implementation. The illustrated computer 602 is intended to encompass any computing device such as a server, desktop computer, laptop/notebook computer, one or more processors within these devices, or any other processing device, including physical or virtual instances (or both) of the computing device. Additionally, the computer 602 can include a computer that includes an input device, such as a keypad, keyboard, touch screen, or other device that can accept user information, and an output device that conveys information associated with the operation of the computer 602, including digital data, visual, audio information, or a combination of information.

The computer 602 includes an interface 604. Although illustrated as a single interface 604 in FIG. 6, two or more interfaces 604 may be used according to particular needs, desires, or particular implementations of the computer 602. Although not shown in FIG. 6, the computer 602 can be communicably coupled with a network. The interface 604 is used by the computer 602 for communicating with other systems that are connected to the network in a distributed environment. Generally, the interface 604 comprises logic encoded in software or hardware (or a combination of software and hardware) and is operable to communicate with the network. More specifically, the interface 604 may comprise software supporting one or more communication protocols associated with communications such that the network or interface's hardware is operable to communicate physical signals within and outside of the illustrated computer 602.

The computer 602 includes a processor 605. Although illustrated as a single processor 605 in FIG. 6, two or more processors may be used according to particular needs, desires, or particular implementations of the computer 602. Generally, the processor 605 executes instructions and manipulates data to perform the operations of the computer 602 and any algorithms, methods, functions, processes, flows, and procedures as described in this specification.

The computer 602 can also include a database 606 that can hold data for the computer 602 or other components (or a combination of both) that can be connected to the network. Although illustrated as a single database 606 in FIG. 6, two or more databases (of the same or combination of types) can be used according to particular needs, desires, or particular implementations of the computer 602 and the described functionality. While database 606 is illustrated as an integral component of the computer 602, database 606 can be external to the computer 602.

The computer 602 also includes a memory 607 that can hold data for the computer 602 or other components (or a combination of both) that can be connected to the network. Although illustrated as a single memory 607 in FIG. 6, two or more memories 607 (of the same or combination of types) can be used according to particular needs, desires, or particular implementations of the computer 602 and the described functionality. While memory 607 is illustrated as an integral component of the computer 602, memory 607 can be external to the computer 602. The memory 607 can be a transitory or non-transitory storage medium.

The memory 607 stores computer-readable instructions executable by the processor 605 that, when executed, cause the processor 605 to perform operations, such as performing an NMR measurement on the core sample (for example, step 204, step 206b, step 208b, step 304, or step 306b), determining an RI (for example, step 210 or step 308), and data-fitting. The computer 602 can also include a power supply 614. The power supply 614 can include a rechargeable or non-rechargeable battery that can be configured to be either user- or non-user-replaceable. The power supply 614 can be hard-wired. There may be any number of computers 602 associated with, or external to, a computer system containing computer 602, each computer 602 communicating over the network. Further, the term "client," "user," "operator," and other appropriate terminology may be used interchangeably, as appropriate, without departing from this specification. Moreover, this specification contemplates that many users may use one computer 602, or that one user may use multiple computers 602.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

As used in this disclosure, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, it is to be understood that the phraseology or terminology employed in this disclosure, and not otherwise defined, is for the purpose of description only and not of limitation. Any use of section headings is intended to aid reading of the document and is not to be interpreted as limiting; information that is relevant to a section heading may occur within or outside of that particular section.

As used in this disclosure, the term "about" or "approximately" can allow for a degree of variability in a value or range, for example, within 10%, within 5%, or within 1% of a stated value or of a stated limit of a range.

As used in this disclosure, the term "substantially" refers to a majority of, or mostly, as in at least about 50%, 60%, 70%, 80%, 90%, 95%, 96%, 97%, 98%, 99%, 99.5%, 99.9%, 99.99%, or at least about 99.999% or more.

Values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "0.1% to about 5%" or "0.1% to 5%" should be interpreted to include about 0.1% to about 5%, as well as the individual values (for example, 1%, 2%, 3%, and 4%) and the sub-ranges (for example, 0.1% to 0.5%, 1.1% to 2.2%, 3.3% to 4.4%) within the indicated range. The statement "X to Y" has the same meaning as "about X to about Y," unless indicated otherwise. Likewise, the statement "X, Y, or Z" has the same meaning as "about X, about Y, or about Z," unless indicated otherwise.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations, and it should be understood that the described components and systems can generally be integrated together or packaged into multiple products.

Accordingly, the previously described example implementations do not define or constrain the present disclosure. Other changes, substitutions, and alterations are also possible without departing from the spirit and scope of the present disclosure.

What is claimed is:

1. A method comprising:
   determining a porosity model of a core sample obtained from a subterranean formation, the porosity model comprising a macroporosity group and a microporosity group, the macroporosity group associated with inscribed spheres representing pores of the core sample, and the microporosity group associated with a crevice network representing crevices in between the pores of the core sample;

performing a first nuclear magnetic resonance (NMR) measurement to obtain a first NMR $T_2$ distribution of the core sample;

performing a first desaturation step on the core sample, the first desaturation step comprising centrifuging the core sample at a first rotational speed;

performing a second NMR measurement to obtain a second NMR $T_2$ distribution of the core sample after the first desaturation step;

performing a second desaturation step on the core sample, the second desaturation step comprising centrifuging the core sample at a second rotational speed greater than the first rotational speed;

performing a third NMR measurement to obtain a third NMR $T_2$ distribution of the core sample after the second desaturation step;

determining a resistivity index of the subterranean formation at least based on the porosity model, the first, second, and third NMR $T_2$ distributions of the core sample.

2. The method of claim 1, wherein the subterranean formation from which the core sample is obtained comprises a clastic reservoir or a carbonate reservoir.

3. The method of claim 2, wherein the first rotational speed is in a range of from about 500 revolutions per minute (rpm) to about 4,000 rpm, and the second rotational speed is in a range of from about 4,000 rpm to about 6,000 rpm.

4. The method of claim 3, comprising:
performing a third desaturation step on the core sample, the third desaturation step comprising centrifuging the core sample at a third rotational speed greater than the second rotational speed; and
performing a fourth NMR measurement to obtain a fourth NMR $T_2$ distribution of the core sample after the third desaturation step, wherein determining the resistivity index of the subterranean formation comprises determining the resistivity index at least based on the porosity model, the first, second, third, and fourth NMR $T_2$ distributions of the core sample.

5. The method of claim 4, wherein the third rotational speed is in a range of from about 6,000 rpm to about 8,000 rpm.

6. The method of claim 2, wherein determining the resistivity index of the subterranean formation comprises determining a combination of a first saturation exponent associated with the macroporosity group and a second saturation exponent associated with the microporosity group that correlates to the first, second, and third NMR $T_2$ distributions of the core sample.

7. The method of claim 6, wherein the resistivity index (RI) is determined to be:

$$RI = \frac{1}{S_w^{\left(\frac{n_1 S_{w1}}{S_w} + \frac{n_2 S_{w2}}{S_w}\right)}}$$

wherein $S_{w1}$ is a water saturation of the macroporosity group, $n_1$ is the first saturation exponent associated with the macroporosity group, $S_{w2}$ is a water saturation of the microporosity group, and $n_2$ is the second saturation exponent associated with the microporosity group.

8. The method of claim 7, wherein determining the combination of the first saturation exponent and the second saturation exponent that correlates to the first, second, and third NMR $T_2$ distributions of the core sample comprises generating a log-log plot for the resistivity index and water saturation of the core sample.

9. A method comprising:
determining a porosity model of a core sample obtained from a subterranean formation, the porosity model comprising a macroporosity group and a microporosity group, the macroporosity group associated with pores of the core sample, and the microporosity group associated with crevices in between the pores of the core sample;
performing a nuclear magnetic resonance (NMR) measurement to obtain an NMR $T_2$ distribution of the core sample at 100% water saturation;
performing a plurality of desaturation steps on the core sample, each desaturation step comprising centrifuging the core sample at different rotational speeds;
for each desaturation step, performing an NMR measurement to obtain an NMR $T_2$ distribution of the core sample;
determining a resistivity index of the subterranean formation at least based on the porosity model and each of the NMR $T_2$ distributions.

10. The method of claim 9, wherein determining the resistivity index of the subterranean formation comprises determining a combination of a first saturation exponent associated with the macroporosity group and a second saturation exponent associated with the microporosity group that correlates to each of the NMR $T_2$ distributions.

11. The method of claim 10 wherein the resistivity index (RI) is determined to be:

$$RI = \frac{1}{S_w^{\left(\frac{n_1 S_{w1}}{S_w} + \frac{n_2 S_{w2}}{S_w}\right)}}$$

wherein $S_{w1}$ is a water saturation of the macroporosity group, $n_1$ is the first saturation exponent associated with the macroporosity group, $S_{w2}$ is a water saturation of the microporosity group, and $n_2$ is the second saturation exponent associated with the microporosity group.

12. The method of claim 11, wherein each of the rotational speeds are in a range of from about 500 revolutions per minute (rpm) to about 8,000 rpm.

13. The method of claim 12, wherein each subsequent rotational speed is greater than its preceding rotational speed.

14. The method of claim 13, wherein determining the combination of the first saturation exponent and the second saturation exponent that correlates to the NMR $T_2$ distributions of the core sample comprises generating a log-log plot for the resistivity index and water saturation of the core sample.

* * * * *